(12) United States Patent
Kunimatsu et al.

(10) Patent No.: US 7,145,223 B2
(45) Date of Patent: Dec. 5, 2006

(54) SEMICONDUCTOR DEVICE

(75) Inventors: Takashi Kunimatsu, Osaka (JP); Minoru Fukui, Osaka (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 0 days.

(21) Appl. No.: 10/423,944

(22) Filed: Apr. 28, 2003

(65) Prior Publication Data
US 2003/0218241 A1 Nov. 27, 2003

(30) Foreign Application Priority Data
May 22, 2002 (JP) ............... 2002-147416

(51) Int. Cl.
*H01L 23/02* (2006.01)
(52) U.S. Cl. .................. 257/678; 257/666
(58) Field of Classification Search ........ 257/666–678, 257/687, 777; 361/600, 723, 730, 735, E33.066
See application file for complete search history.

(56) References Cited

U.S. PATENT DOCUMENTS

| | | | | |
|---|---|---|---|---|
| 5,057,906 A | * | 10/1991 | Ishigami | 257/706 |
| 5,434,449 A | * | 7/1995 | Himeno et al. | 257/690 |
| 5,459,350 A | * | 10/1995 | Date et al. | 257/666 |
| 5,563,441 A | * | 10/1996 | Kato | 257/666 |
| 5,767,573 A | * | 6/1998 | Noda et al. | 257/675 |
| 6,002,166 A | * | 12/1999 | Noda et al. | 257/666 |
| 6,313,520 B1 | * | 11/2001 | Yoshida et al. | 257/676 |
| 6,353,265 B1 | * | 3/2002 | Michii | 257/777 |
| 6,563,203 B1 | * | 5/2003 | Nishimura | 257/676 |
| 6,574,107 B1 | * | 6/2003 | Jeon et al. | 361/709 |
| 6,603,197 B1 | * | 8/2003 | Yoshida et al. | 257/676 |
| 2002/0149103 A1 | * | 10/2002 | Yang et al. | 257/723 |
| 2004/0094826 A1 | * | 5/2004 | Yang et al. | 257/666 |

FOREIGN PATENT DOCUMENTS

JP    8-279590    10/1996

\* cited by examiner

*Primary Examiner*—Nathan W. Ha
(74) *Attorney, Agent, or Firm*—McDermott Will & Emery LLP

(57) ABSTRACT

The semiconductor device of this invention includes a first die pad down-set away from boundary portions between inner lead portions and outer lead portions; a first semiconductor chip mounted on the first die pad; a chip-shaped electronic component with a small thickness mounted on a second die pad formed by increasing the width of at least one of the inner lead portions; metal wires; leads each having an inner lead portion and an outer lead portion; and an encapsulation resin part for encapsulating the die pads, the semiconductor chip, the chip-shaped electronic component, the inner lead portions and the metal wires.

25 Claims, 4 Drawing Sheets

SEMICONDUCTOR DEVICE

BACKGROUND OF THE INVENTION

The present invention relates to a semiconductor device, and more particularly, it relates to a semiconductor device including a plurality of devices mounted on a lead frame.

A semiconductor device including one or more semiconductor chips mounted on one face of a die pad of a lead frame and encapsulated with a resin is widely used. As a first example of typical semiconductor devices currently used, FIGS. 5A through 5C show the structure of a 14-pin SOP (Small Outline Package) disclosed in Japanese Laid-Open Patent Publication No. 8-279590. FIG. 5A is a plan view of the semiconductor device, FIG. 5B is a side view thereof and FIG. 5C is a cross-sectional view thereof taken along line A–A' of FIG. 5A.

As shown in FIGS. 5A through 5C, a bare chip 102 is disposed on a die pad 101, and the bare chip 102 is connected to a lead 107 through a bonding wire 106 to be electrically connected to an external circuit. A base body including the die pad 101, the bare chip 102 and the lead 107 is encapsulated with a package mold 108.

Also, as a second example, FIGS. 6A and 6B show the cross-sectional structure of a semiconductor device including a plurality of semiconductor chips that is disclosed in Japanese Laid-Open Patent Publication No. 8-279590. FIGS. 6A and 6B respectively show the cross-sections taken in different positions. As shown in FIGS. 6A and 6B, a first bare chip 102 is mounted on the top face of a die pad 101 and a second bare chip 202 is mounted on the reverse face of the die pad 101. The bare chips 102 and 202 are identical to each other. The first bare chip 102 is connected, through bonding wires 106, to inner lead portions 107a of leads 107 included in the same lead frame as the die pad 101. The second bare chip 202 is connected, through bonding wires 206, to inner lead portions 207a of leads 207 included in a second lead frame disposed below the die pad 101. These elements are encapsulated with a package mold 108.

In the first example of the conventional semiconductor devices in which a semiconductor chip is mounted on one face of a die pad, the number of semiconductor chips that can be formed within one package is one, and therefore, the degree of integration within the semiconductor device is low.

On the other hand, in the second example shown in FIGS. 6A and 6B, since semiconductor chips are mounted on both the top and reverse faces of a die pad of one lead frame, the degree of integration within the semiconductor device can be increased. However, it is necessary to perform, on both the top and reverse faces of one lead frame, chip mounting processing for mounting the semiconductor chips on the lead frame and wire bonding processing for connecting electrodes of the semiconductor chips to inner lead portions through metal wires. Therefore, the fabrication process is disadvantageously complicated. For example, when one semiconductor chip is assembled after assembling another semiconductor chip, the previously assembled semiconductor chip is pressed, which can be a factor to cause assembly defective. In order to overcome this problem of assembly defective, special assembly facilities are disadvantageously necessary.

Also, when a semiconductor chip is mounted on each of the two faces of one lead frame, the thickness of the resultant package is large, and hence, a large packaging space for the thick package is necessary. This is not suitable to high-density packaging of electronic equipment.

SUMMARY OF THE INVENTION

The present invention was devised to overcome the aforementioned conventional disadvantages, and an object of the invention is providing a semiconductor device in which a plurality of semiconductor chips or chip components can be contained within a package with a thickness equivalent to or smaller than that of a package containing one semiconductor chip.

The semiconductor device of this invention includes a first die pad; a second die pad; a first semiconductor chip mounted on the first die pad; a chip-shaped electronic component mounted on the second die pad; a plurality of leads arranged around the first die pad; a plurality of metal wires for electrically connecting the first semiconductor chip and the chip-shaped electronic component to the leads; and an encapsulation resin part for integrally mold-encapsulating the first die pad, the second die pad, part of each of the leads, the first semiconductor chip, the chip-shaped electronic component and the metal wires, and each of the leads has an inner lead portion mold-encapsulated within the encapsulation resin part and an outer lead portion protruding outside from the encapsulation resin part, the first die pad is provided in a position below boundary portions between the inner lead portions and the outer lead portions of the leads, the chip-shaped electronic component is smaller than the first semiconductor chip, and the second die pad is formed by increasing a width of at least one of the inner lead portions and has a face thereof used for mounting the chip-shaped electronic component on the same side as a face of the first die pad used for mounting the first semiconductor chip.

The chip-shaped electronic component preferably has a thickness substantially a half of a thickness of the first semiconductor chip.

The chip-shaped electronic component is preferably a chip capacitor or a second semiconductor chip.

In one aspect, the first semiconductor chip includes a switching device and a control circuit for the switching device, and the chip-shaped electronic component is a diode elemental chip.

The encapsulation resin part preferably has a thickness of 1 mm or less.

In one aspect, a face of the first die pad opposite to the face used for mounting the first semiconductor chip is exposed from the encapsulation resin part.

In one aspect, the second die pad is provided in a position lower than the boundary portions between the inner lead portions and the outer lead portions of the leads.

DETAILED DESCRIPTION OF THE INVENTION

Figure 1A:
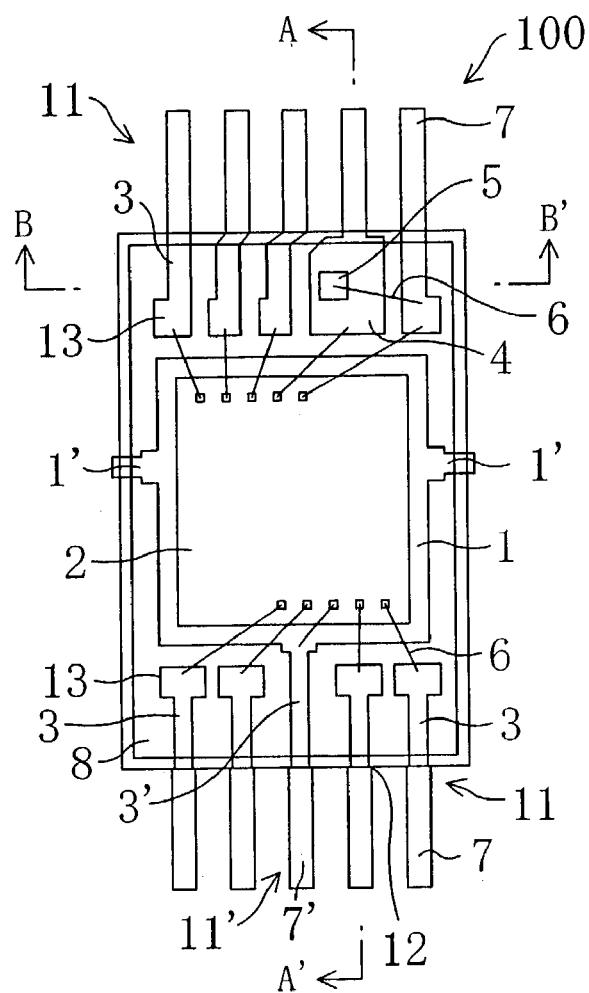
FIGS. 1A, 1B and 1C are diagrams for schematically showing the package structure of a semiconductor device according to Embodiment 1 of the invention and are respectively a top perspective view thereof, a cross-sectional view thereof taken along line A–A' of FIG. 1A and a cross-sectional view thereof taken along line B–B' of FIG. 1A.

A semiconductor device according to the invention will now be described in detail with reference to the accompanying drawings. In the drawings referred to below, like reference numerals are used to refer to elements with substantially like functions for the sake of simplification. It is noted that preferred embodiments described below do not limit the invention.

Herein, a multichip semiconductor device according to an embodiment of the invention applied to a 10-pin TSSOP (Thin Shrink Small Outline Package) will be exemplified.

Embodiment 1

Figure 1B:
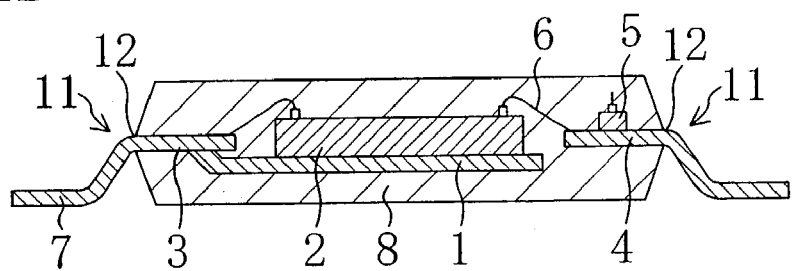
Figure 1C:
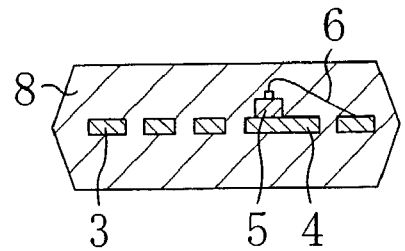

FIGS. 1A through 1C are diagrams for schematically showing the structure of a semiconductor device 100 according to Embodiment 1, and specifically, FIG. 1A is a perspective top view of the 10-pin TSSOP, FIG. 1B is a cross-sectional view thereof taken along line A–A' of FIG. 1A and FIG. 1C is a cross-sectional view thereof taken along line B–B' of FIG. 1A.

The semiconductor device 100 of this embodiment includes a first die pad 1, a first semiconductor chip 2 mounted thereon, a second die pad 4, a chip-shaped electronic component 5 mounted thereon, and a plurality of leads 11 arranged around the first die pad 1. The first semiconductor chip 2 and the chip-shaped electronic component 5 are respectively electrically connected to the leads 11 through metal wires 6. The first and second die pads 1 and 4, the first semiconductor chip 2, the chip-shaped electronic component 5, part of the respective leads 11 and the metal wires 6 are integrally mold-encapsulated with a resin, and this encapsulated portion with the resin corresponds to an encapsulation resin part 8.

Each of the leads 11 has an inner lead portion 3 and an outer lead portion 7, and the inner lead portion 3 is encapsulated with the resin, namely, mold-encapsulated within the encapsulation resin part 8. The outer lead portion 7 protrudes outside from the encapsulation resin part 8, and a boundary portion 12 between the inner lead portion 3 and the outer lead portion 7 corresponds to a crossing portion between the lead 11 and the surface of the encapsulation resin part 8, namely, corresponds to a boundary between a portion of the lead present inside the encapsulation resin part 8 and a portion thereof present outside the encapsulation resin part 8.

One of the plural leads 11 is connected to the first die pad 1 so as to support the first die pad 1. This lead 11' is a grounding lead, which has a grounding inner lead portion 3' and a grounding outer lead portion 7'.

The first die pad 1, the second die pad 4 and the respective leads 11 are together fabricated as a lead frame, and they are cut out from the outer frame (not shown) of the lead frame after the resin encapsulating processing so as to be in the shape as shown in FIGS. 1A through 1C. In the original lead frame, the first die pad 1 is connected to the outer frame of the lead frame through two supporting leads 1' extending in a direction perpendicular to the leads 11, so as to be fixedly supported. In the semiconductor device 100 of this embodiment shown in FIGS. 1A through 1C, however, the first die pad 1 is cut out from the outer frame and the supporting leads 1' alone remain. The first die pad 1 is supported and fixed along the three directions by these supporting leads 1' and the grounding inner lead portion 3'.

In this embodiment, one of the inner lead portions 3 has a large width to work as the second die pad 4. The inner lead portion 3 used to form the second die pad 4 has a width larger than those of the other inner lead portions 3 or at least the adjacent inner lead portions 3, so that the chip-shaped electronic component 5 can be mounted thereon. The face used for mounting the chip-shaped electronic component 5 is on the same side as the chip-mounting face of the first die pad 1.

Each of the inner lead portions 3 has a tip 13 with a slightly large width so as to be engaged with the encapsulation resin part 8, and thus, the inner lead portions 3 are prevented from falling off from the encapsulation resin part 8.

The second die pad 4 is formed by increasing the width of one of the plural inner lead portions 3 arranged around the first die pad 1 at predetermined intervals. Therefore, the die pad area is restricted depending upon the distance from the adjacent inner lead portions 3, and hence cannot be very large. Therefore, the semiconductor chip or the like with a comparatively large area is mounted on the first die pad 1, and the chip-shaped electronic component 5 (namely, a chip component of a small elemental device such as a diode) smaller than the semiconductor chip 2 mounted on the first die pad 1 is mounted on the second die pad 4.

Also, the bottom of the first semiconductor chip 2 is fixed on the first die pad 1 with a soldering material (not shown) such as silver paste or gold and is electrically connected to the first die pad 1. Accordingly, since this first semiconductor chip 2 is grounded through the grounding outer lead portion 7', the grounding inner lead portion 3' and the first die pad 1, a shielding effect can be attained, and hence, it is minimally affected by noise from other peripheral ICs (not shown) provided on the same print wiring board (not shown), so that electronic circuits integrated in the first semiconductor chip 1 can stably operate.

As shown in FIG. 1B, the first die pad 1 is down-set away from the inner lead portions 3. Since each inner lead portion 3 extends horizontally from the boundary portion 12 between the inner lead portion 3 and the outer lead portion 7, it can be said that the first die pad 1 is disposed below the boundary portions 12. Accordingly, the thickness of the resin covering the first semiconductor chip 2 mounted on the first die pad 1 can be large, and therefore, even when a high voltage switching device is integrated in the first semiconductor chip 2, a sufficiently high dielectric voltage can be secured.

The securement of the dielectric voltage will be described in more detail. In a conventional resin-encapsulated semiconductor device using a lead frame, when the package thickness (i.e., the thickness of the encapsulation resin part 8) is, for example, approximately 1 mm, a semiconductor chip with a withstand voltage of approximately 30 V is included. A semiconductor device including a semiconductor chip with a withstand voltage of 100 through 200 V should have a package thickness of approximately 1.5 mm. This is because a sufficiently high dielectric voltage cannot be secured unless the resin covering the semiconductor chip is sufficiently thick.

In the semiconductor device 100 of this embodiment, however, since the first die pad 1 is disposed below the boundary portions 12 between the inner lead portions 3 and the outer lead portions 7, the thickness of the resin covering the semiconductor chip can be larger than in the conventional semiconductor device even when their package thicknesses are the same. Accordingly, even when the package thickness is smaller than in the conventional semiconductor device, a sufficiently high dielectric voltage can be secured.

By minimizing the thickness of the resin covering the first semiconductor chip 2 to reduce the thickness of the resin for encapsulating the whole package, the thickness of the encapsulation resin part 8 can be reduced to 1 mm or less. In this embodiment, the lead frame with a thickness of the leads 11, the first and second die pads 1 and 4 of approximately 130 μm and the first semiconductor chip 1 with a thickness of approximately 300 μm are used and the extent of the down-set of the first die pad 1 (namely, a shift distance to the downward direction) is approximately 180 μm, so that the thickness of the encapsulation resin part 8 can be approximately 1 mm.

Next, the chip-shaped electronic component 5 will be described. In the wire bonding processing, wire bonding work cannot be smoothly performed unless the metal wire 6 has a certain large length, and the top of the metal wire 6 obtained after the bonding tends to be higher as the distance of the metal wire 6 extending in the horizontal direction (namely, a direction parallel to the chip-mounting face of the first die pad 1) is shorter. Since the metal wire 6 used for connecting the chip-shaped electronic component 5 mounted on the second die pad 4 to the adjacent inner lead portion 3 has a small length, the top of this metal wire 6 tends to be high, and hence, the thickness of the resin covering this metal wire 6 tends to be small. When the thickness of the resin covering the metal wire 6 is thus small, the dielectric voltage of the semiconductor device 100 cannot be sufficiently secured, and therefore, the semiconductor device 1 may be damaged when a high voltage is applied.

In this embodiment, however, the thickness of the chip-shaped electronic component 5 mounted on the second die pad 4 is reduced through polishing to approximately 150 μm, that is, substantially a half of the thickness of the first semiconductor chip 2 (of approximately 300 μm). Therefore, the resin covering the chip-shaped electronic component 5 can be sufficiently thick for securing a sufficient dielectric voltage. Also, since the thickness of the resin covering the chip-shaped electronic component 5 thus has a margin, the thickness of the whole package can be reduced.

In particular, in the case where a high voltage switching device is formed within the first semiconductor chip 2, it is necessary to provide a sufficiently large thickness to the resin covering the metal wire 6 in consideration of the dielectric voltage. Therefore, when the first die pad 1 is thus down-set, the reduction of the package thickness and the securement of the dielectric voltage can be both attained.

Figure 4:
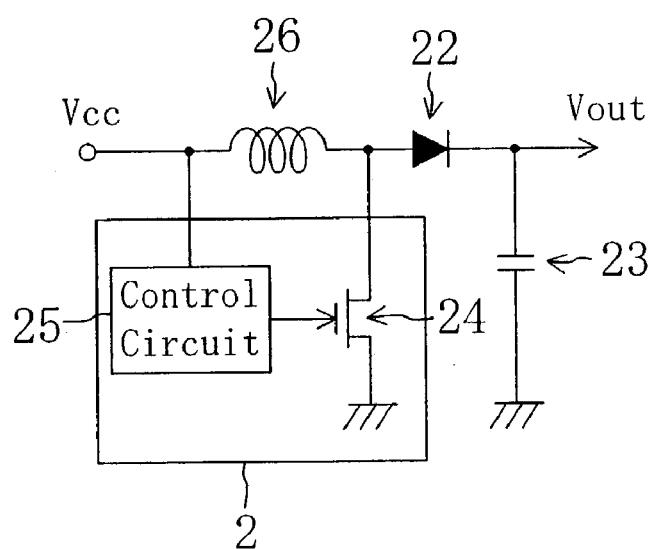
FIG. 4 is a circuit diagram for showing a circuit configuration employed in an embodiment of the invention.
Figure 5A:
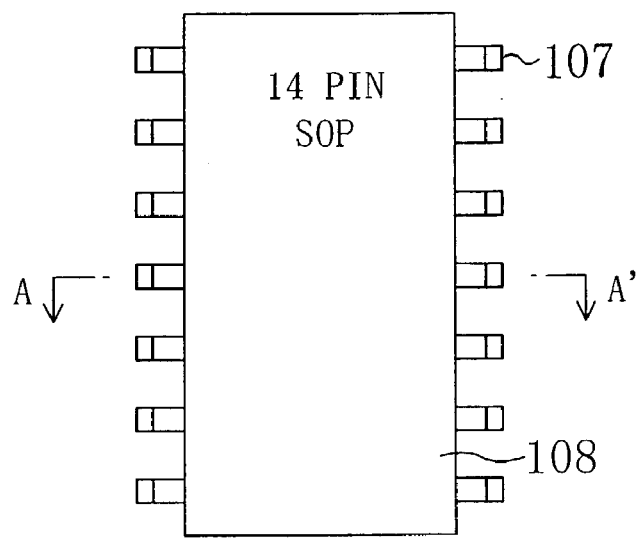
FIGS. 5A, 5B and 5C are diagrams for showing the structure of a conventional typical semiconductor device.
Figure 5B:
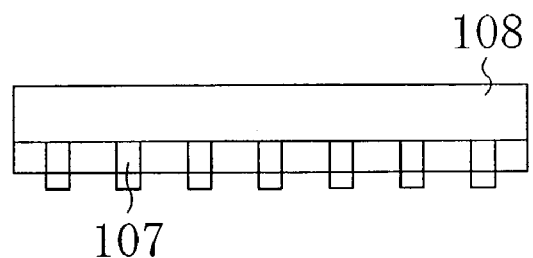
Figure 5C:
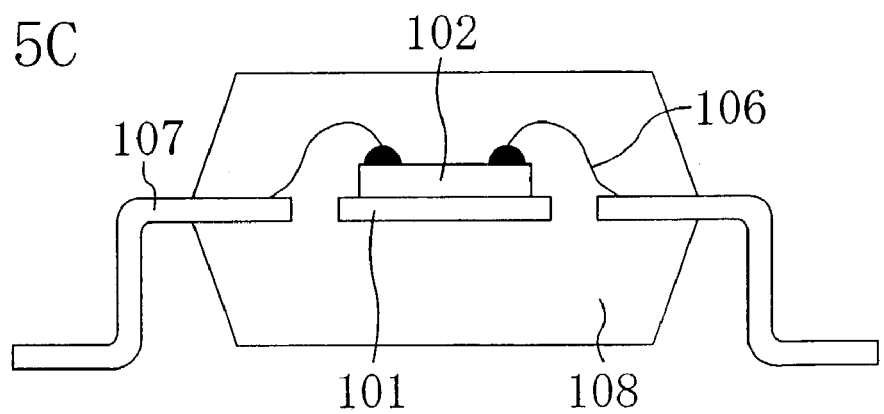
Figure 6A:
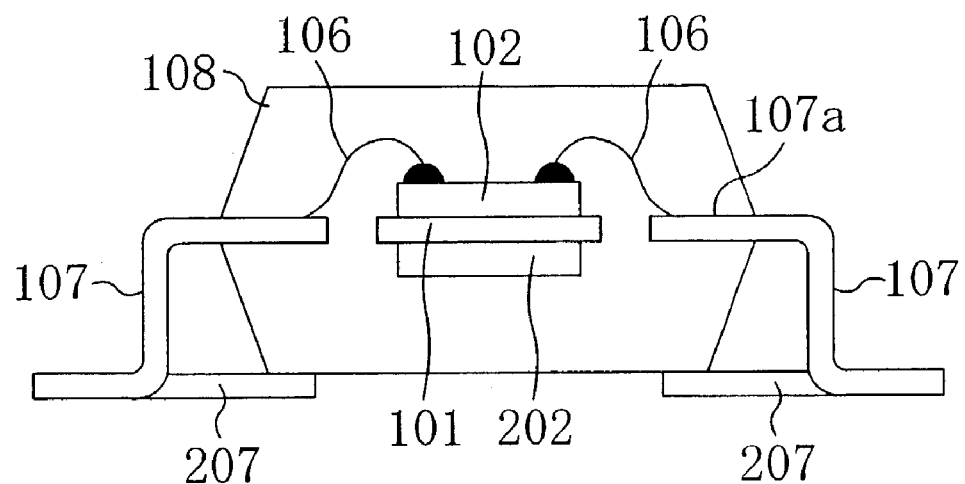
FIGS. 6A and 6B are cross-sectional views of a conventional semiconductor device including multiple chips.
Figure 6B:
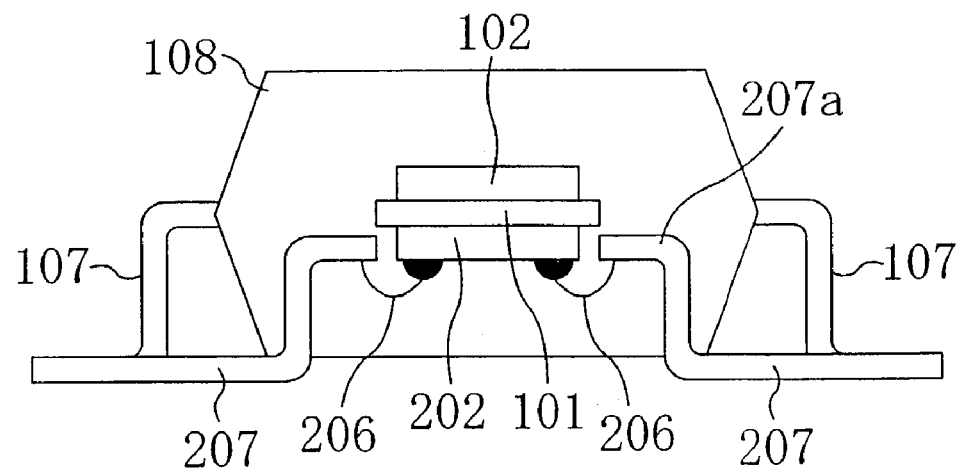

Now, a switched mode power supply circuit using the first semiconductor chip 2 is shown in FIG. 4. In the first semiconductor chip (IC) 2, a power transistor 24 serving as a switching device and a control circuit 25 for controlling the switching device are formed. The switched mode power supply circuit additionally includes a coil 26, a diode 22 and a capacitor 23. In this embodiment, the diode 22, that is, a second semiconductor chip, is used as the chip-shaped electronic component 5, and the IC 2 and the diode 22 are together encapsulated within the semiconductor device 100.

As another example, in the case where an electronic circuit other than the switched mode power supply circuit is to be obtained, a chip-shaped capacitor 23 can be used as the electronic component 5 instead of the diode 22. In this case, although a chip component that is an external component of the first semiconductor chip 2 is contained in one and the same package, the thickness of the whole package can be reduced.

Furthermore, in the case where the chip-shaped electronic component 5 is an elemental chip of the diode 22, since the diode 22 has a small chip size, even when its thickness is reduced to be smaller than that of a general semiconductor chip (the first semiconductor chip 2), specifically, to substantially a half of that of the first semiconductor chip, the diode 22 can withstand stress applied during the fabrication process such as the wire bonding processing and the dice bonding processing. Therefore, when the elemental chip of the diode 22, that is, the second semiconductor chip, is mounted on the second die pad 4 and the first semiconductor chip 2 in which the switching device (the power transistor 24) and the control circuit 25 of FIG. 4 are integrated is mounted on the first die pad 1, a switched mode power supply circuit for switch-controlling the coil 26 with the switching device and rectifying the induced voltage of the coil 26 with the diode 22 is contained in one package. Thus, the semiconductor device 100 for the switched mode power supply can be fabricated in a small thickness and a small size. In addition, since a peripheral component of the first semiconductor chip 2 can be thus incorporated into the same package as a chip component, a semiconductor device for the switched mode power supply with fewer peripheral components can be realized.

In this case, as the rectifying diode for the switched mode power supply circuit, it should be noted that a Schottky diode with a small forward diode voltage VF is preferable. It is clearly advantageous to form the diode and the integrated circuits (the first semiconductor chip 2) on the same silicon substrate, in view of easy assembling. However, this involves following two problems and leads to difficulty in forming the integrated circuits of the first semiconductor chip 2 and the Schottky diode on the same silicon substrate.

First, when an ordinary diode formed in the first semiconductor chip 2 is used for the rectifying circuit instead of the Schottky diode, the power loss in the rectifying operation is disadvantageously large because the forward diode voltage of the ordinary diode is large.

Second, when a semiconductor wafer on which a barrier metal is deposited is introduced into a diffusion furnace in order to form a Schottky diode and the integrated circuits of the first semiconductor chip 2 on the same silicon substrate, the diffusion furnace is contaminated. The contamination involves change in electric characteristics of a general semiconductor element (transistor, thyristor, diode and the like) having no barrier metal, thereby lowering the yield of the semiconductor device.

On the other hand, in this embodiment, the above disadvantages can be prevented because the Schottky diode and the integrated circuits are separately formed. In addition, when the chip of a Schottky diode is mounted on the second die pad 4, it is possible to fabricate a thin and compact semiconductor device 100 for the switched mode power supply in which the power loss in the rectifying operation is reduced and the power efficiency is increased.

In this embodiment, the second die pad 4 is formed by increasing the substantially whole width of one inner lead portion 3 and the width is substantially constant in a direction toward the first die pad 1. Instead, the second die pad 4 can be formed by increasing the width of merely a portion of one inner lead portion 3 depending upon the size of the chip-shaped electronic component 5, the size of the whole semiconductor device 100, the position of the second die pad 4 and the number and the arrangement of the inner lead portions 3. In this case, the portion with the increased width preferably includes the tip of the inner lead portion. Alternatively, two or more inner lead portions 3 can be used to form the second die pad 4. In this case, the two or more inner lead portions 3 may be connected to one another.

In order to secure the assembly strength and secure the dielectric voltage of the whole semiconductor device 100, the thickness of the chip-shaped electronic component 5 is preferably 30% or more and 70% or less, and more preferably 40% or more and 60% or less of the thickness of the first semiconductor chip 2.

Embodiment 2

Figure 2:
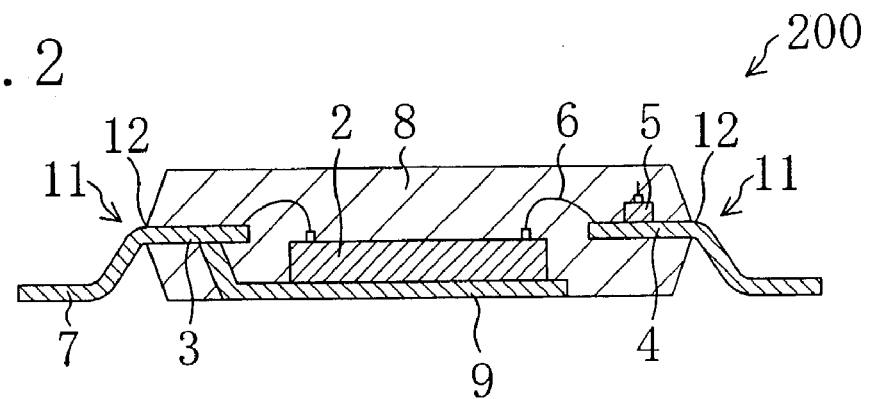
FIG. 2 is a cross-sectional view of a semiconductor device according to Embodiment 2 of the invention.

FIG. 2 is a cross-sectional view for showing the structure of a main part of a semiconductor device 200 exemplifying Embodiment 2 of the invention. In the structure of Embodiment 2, a first die pad 9 is provided in a position further lower than boundary portions 12 between inner lead portions 3 and outer lead portions 7 than in the aforementioned structure of Embodiment 1 (shown in FIGS. 1A through 1C), and the reverse face of the first die pad 9 is exposed from an encapsulation resin part 8.

Owing to this structure, the thickness of a resin covering a first semiconductor chip 2 and metal wires 6 can be increased without increasing the package thickness, and hence, a higher voltage switching device can be formed in the first semiconductor chip 2. Also, the first die pad 9 exposed on the reverse face of the encapsulation resin part 8 can use its reverse face as a heat dissipation face for dissipating heat generated from the first semiconductor chip 2. Therefore, as compared with the case where the first die pad 9 is not exposed, the allowable dissipation of the package can be increased. Furthermore, when the first die pad 9 is assembled with its reverse face soldered onto a conducting foil (such as a copper foil) provided on a print wiring board (not shown), a higher heat dissipation effect can be attained in the assembly, so that the substantial allowable dissipation of the package can be further increased.

Embodiment 3

Figure 3:
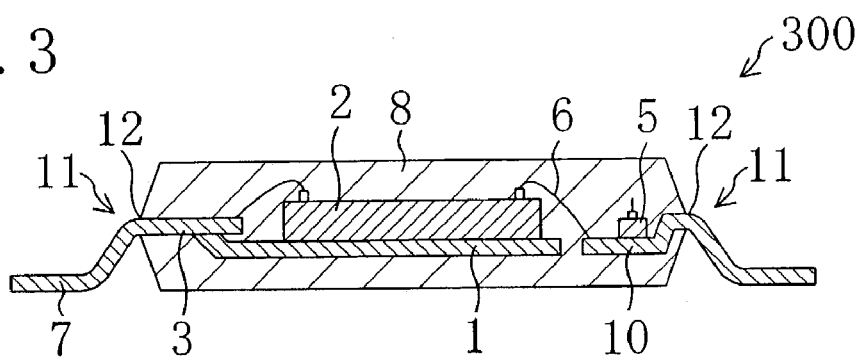
FIG. 3 is a cross-sectional view of a semiconductor device according to Embodiment 3 of the invention.

FIG. 3 is a cross-sectional view for showing the structure of a main part of a semiconductor device 300 exemplifying Embodiment 3 of the invention. The semiconductor device of Embodiment 3 is the same as that of Embodiment 1 (shown in FIGS. 1A through 1C) except that a second die pad 10 is provided in a position lower than boundary portions 12 between inner lead portions 3 and outer lead portions 7.

Owing to this structure, the thickness of a resin covering a chip-shaped electronic component 5 mounted on the second die pad 10 is large, and therefore, the dielectric voltage of the chip-shaped electronic component 5 can be increased by increasing the thickness of the resin covering a metal wire 6 used for connecting the chip-shaped electronic component 5 to an adjacent inner lead portion 3.

Although not shown in detail in a drawing, when the first die pad 9 that is largely down-set and is exposed on the reverse face and the second die pad 10 that is down-set away from the boundary portions 12 are combined, a margin can be attained in the thickness of the resin covering the first semiconductor chip 2 and the chip-shaped electronic component 5. Therefore, the dielectric voltage can be further increased as well as the thickness of the whole package can be further reduced. In other words, when Embodiments 2 and 3 of this invention are combined, a thin and compact surface-mount package having large allowable dissipation can be fabricated.

As described so far, according to a semiconductor device of this invention, a first die pad is provided in a position below boundary portions between inner lead portions and outer lead portions, a second die pad is formed by increasing the width of at least one of the inner lead portions, and a first semiconductor chip and a compact chip component are respectively mounted on the faces on the same side of the two die pads. As a result, the first semiconductor chip and the compact chip component can be contained in one and the same package with a thin encapsulation resin so as to attain a high packaging density, and the thickness of the resin covering the semiconductor chip can be sufficiently secured so as to increase the dielectric voltage.

What is claimed is:

1. A semiconductor device comprising:
a first die pad having a first surface and a second surface opposite to said first surface;
a second die pad;
a first semiconductor chip mounted on the first surface of the first die pad;
a chip-shaped electronic component mounted on the second die pad;
a plurality of leads arranged around the first die pad;
a plurality of metal wires for electrically connecting the first semiconductor chip and the chip-shaped electronic component to the leads; and
an encapsulation resin part for integrally mold-encapsulating the first die pad, the second die pad, part of each of the leads, the first semiconductor chip, the chip-shaped electronic component and the metal wires, said encapsulation resin part being configured such that the second surface is one of exposed to outside the encapsulation resin part and facing a portion of the encapsulation resin part which extends to a bottom surface of the encapsulation resin part,
wherein each of the leads has an inner lead portion mold-encapsulated within the encapsulation resin part and an outer lead portion protruding outside from the encapsulation resin part,
the first die pad is provided in a position below boundary portions between the inner lead portions and the outer lead portions of the leads,
the chip-shaped electronic component has a smaller thickness than the first semiconductor chip, and the second die pad is formed by increasing a width of at least one of the inner lead portions and has a face thereof used for mounting the chip-shaped electronic component on the same side as a face of the first die pad used for mounting the first semiconductor chip,
wherein a width of one part of the inner lead portion is larger than a width of another part of the inner lead portion,
the plurality of leads are provided at both sides of the first die pad sandwiched therebetween, each of the plurality of leads facing the first die pad,
the first die pad is connected to two supporting leads and at least one of the plurality of leads connected to a ground, and
the two supporting leads extend at both sides of the first die pad sandwiched therebetween, each of the two supporting leads being connected to the first die pad at an outer edge between two sides of the first die pad which faces the plurality of leads,
wherein a width of one part of at least one of the two supporting leads is larger than a width of another part of said at least one of the two supporting leads.

2. The semiconductor device of claim 1,
wherein the chip-shaped electronic component has a thickness substantially a half of a thickness of the first semiconductor chip.

3. The semiconductor device of claim 1,
wherein the chip-shaped electronic component is a chip capacitor or a second semiconductor chip.

4. The semiconductor device of claim 1,
wherein the first semiconductor chip includes a switching device and a control circuit for the switching device, and
the chip-shaped electronic component is a diode elemental chip.

5. The semiconductor device of claim 1,
wherein the encapsulation resin part has a thickness of 1 mm or less.

6. The semiconductor device of claim 1,
wherein a face of the first die pad opposite to the face used for mounting the first semiconductor chip is exposed from the encapsulation resin part.

7. The semiconductor device of claim 1,
wherein the second die pad is provided in a position lower than the boundary portions between the inner lead portions and the outer lead portions of the leads.

8. The semiconductor device of claim 1, wherein the encapsulation resin part covers a bottom surface of the first semiconductor chip and a bottom surface of the chip-shaped electronic component.

9. The semiconductor device of claim 8, wherein the encapsulation resin part further covers a top surface of the first semiconductor chip and a top surface of the chip-shaped electronic component.

10. A semiconductor device comprising:
a first semiconductor chip mounted on a first surface of a first die pad having a second surface opposite to said first surface;
an electronic component mounted on a second die pad;
a plurality of leads arranged ground the first die pad;
a metal wire connecting the first semiconductor chip to the second die pad; and
a package encapsulating the first die pad, the second die pad, part of each of the leads, the first semiconductor chip, the electronic component and the metal wire, said package being configured such that the second surface is one of exposed to outside the package and facing a portion of the package which extends to a bottom surface of the package,
wherein each of the leads has an inner lead portion encapsulated within the package and an outer lead portion protruding outside from the package, and
the first die pad is provided in a position below boundary portions between the inner lead portions and the outer lead portions of the leads, wherein the electronic component has a smaller thickness than the first semiconductor chip,
wherein a width of one part of the inner lead portion is larger than a width of another part of the inner lead portion,
the plurality of leads are provided at both sides of the first die pad sandwiched therebetween, each of the plurality of leads facing the first die pad,
the first die ad is connected to two supporting leads and at least one of the plurality of leads connected to a ground, and
the two supporting leads extend at both sides of the first die pad sandwiched therebetween, each of the two supporting leads being connected to the first die pad at an outer edge between two sides of the first die pad which faces the plurality of leads,
wherein a width of one part of at least one of the two supporting leads is larger than a width of another part of said at least one of the two supporting leads.

11. The semiconductor device of claim 10, wherein the second die pad is formed by increasing a width of at least one of the inner lead portions.

12. The semiconductor device of claim 11, wherein the second die pad has a face thereof used for mounting the electronic component on the same side as a face of the first die pad used for mounting the first semiconductor chip.

13. The semiconductor device of claim 10, wherein at least one of the leads is connected between the first die pad and ground.

14. The semiconductor of claim 10, wherein the first semiconductor chip is connected to the electronic component.

15. The semiconductor device of claim 10, wherein the electronic component has a thickness substantially a half of a thickness of the first semiconductor chip.

16. The semiconductor device of claim 10, wherein the electronic component is a chip capacitor or a second semiconductor chip.

17. The semiconductor device of claim 10, wherein the first semiconductor chip includes a switching device and a control circuit for the switching device, and the electronic component is a diode elemental chip.

18. The semiconductor device of claim 10, wherein the package has a thickness of 1 mm or less.

19. The semiconductor device of claim 10, wherein a face of the first die pad opposite to the face used for mounting the first semiconductor chip is exposed from the package.

20. The semiconductor device of claim 10, wherein the second die pad is provided in a position lower than the boundary portions between the inner lead portions and the outer lead portions of the leads.

21. The semiconductor device of claim 10, wherein the package covers a bottom surface of the first semiconductor chip and a bottom surface of the electronic component.

22. The semiconductor device of claim 21, wherein package further covers a top surface of the first semiconductor chip and a top surface of the electronic component.

23. A semiconductor device comprising:
a first semiconductor chip mounted on a first surface of a first die pad having a second surface opposite to said first surface;
an electronic component mounted on a second die pad;
a plurality of leads arranged ground the first die pad;
a plurality of metal wires for electrically connecting the first semiconductor chip and the electronic component to the leads; and
a package encapsulating the first die pad, the second die pad, part of each of the leads, the first semiconductor chip, the electronic component and the metal wires, said package being configured such that the second surface is one of exposed to outside the package and facing a portion of the package which extends to a bottom surface of the package,
wherein each of the leads has an inner lead portion encapsulated within the package and an outer lead portion protruding outside from the package, and
the first and second die pads are provided in a position below boundary portions between the inner lead portions and the outer lead portions of the leads, wherein the electronic component has a smaller thickness than the first semiconductor chip, wherein a width of one part of the inner lead portion is larger than a width of another part of the inner lead portion, the plurality of leads are provided at both sides of the first die pad sandwiched therebetween, each of the plurality of leads facing the first die pad, the first die pad is connected to two supporting leads and at least one of the plurality of leads connected to a ground, and the two supporting leads extend at both sides of die first die pad sandwiched therebetween, each of the two supporting leads being connected to the first die pad at an outer edge between two sides of the first die pad which faces the plurality of leads, wherein a width of one part of at least one of the two supporting leads is larger than a width of another part of said at least one of the two supporting leads.

24. The semiconductor device of claim 23, wherein the package covers a bottom surface of the first semiconductor chip and a bottom surface of the electronic component.

25. The semiconductor device of claim 24, wherein the package further covers a top surface of the first semiconductor chip and a top surface of the electronic component.

* * * * *